United States Patent
Buller et al.

(10) Patent No.: US 6,949,436 B2
(45) Date of Patent: Sep. 27, 2005

(54) COMPOSITE SPACER LINER FOR IMPROVED TRANSISTOR PERFORMANCE

(75) Inventors: James F. Buller, Austin, TX (US); David Wu, Austin, TX (US); Scott Luning, Austin, TX (US); Derick Wristers, Bee Caves, TX (US); Daniel Kadosh, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/824,428

(22) Filed: Apr. 15, 2004

(65) Prior Publication Data

US 2004/0259343 A1    Dec. 23, 2004

Related U.S. Application Data

(62) Division of application No. 10/021,499, filed on Dec. 19, 2001, now abandoned.

(51) Int. Cl.[7] ............................................ H01L 21/336
(52) U.S. Cl. ...................................... 438/303; 438/265
(58) Field of Search ............................... 438/184, 265, 438/230–232, 301, 595, 303–306

(56) References Cited

U.S. PATENT DOCUMENTS

| | | | |
|---|---|---|---|
| 5,783,475 A * | 7/1998 | Ramaswami | 438/303 |
| 6,057,243 A | 5/2000 | Nagayama | |
| 6,143,613 A | 11/2000 | Lin | |
| 6,235,597 B1 * | 5/2001 | Miles | 438/301 |
| 6,316,304 B1 | 11/2001 | Pradeep et al. | |
| 6,506,650 B1 * | 1/2003 | Yu | 438/301 |
| 6,521,529 B1 * | 2/2003 | Ngo et al. | 438/664 |

* cited by examiner

Primary Examiner—David Vu

(57) ABSTRACT

Semiconductor devices with improved transistor performance are fabricated by forming a composite oxide/nitride liner under a gate electrode sidewall spacer. Embodiments include depositing a conformal oxide layer by decoupled plasma deposition, depositing a conformal nitride layer by decoupled plasma deposition, depositing a spacer layer and then etching.

8 Claims, 5 Drawing Sheets

US 6,949,436 B2

COMPOSITE SPACER LINER FOR IMPROVED TRANSISTOR PERFORMANCE

This application is a DIV of Ser. No. 10/021,499 Dec. 19, 2001 abandoned.

TECHNICAL FIELD

The present invention relates to a semiconductor device having improved transistor performance and enabling methodology. The present invention has particular applicability in fabricating high density semiconductor devices with high speed integrated circuits having submicron design features and shallow junction depths.

BACKGROUND ART

The escalating demand for high density and performance impose severe requirements on semiconductor fabrication technology, particularly for enhanced transistor performance and high operating speed. Transistor performance depends upon various factors and can easily be degraded by various processing operations during fabrication, such as plasma deposition techniques wherein the substrate is exposed to high temperatures and plasmas, as during plasma enhanced chemical vapor deposition. The need for high operating speed also requires the use of dielectric materials having a relatively low dielectric constant, such as about 3.9 or less. The value of a dielectric constant (k) expressed herein is based upon the value of 1 for a vacuum.

In implementing conventional fabrication techniques, as illustrated in FIG. 1, a gate electrode 11 is typically formed over a semiconductor substrate 10 with a gate dielectric layer 12, e.g., gate oxide layer, therebetween. Ion implantation is then conducted to implant shallow source/drain extensions 13. An oxide liner 15 is then formed on side surfaces of gate electrode 11 and the upper surface of substrate 10, as at a thickness of about 50 Å to about 200 Å to protect the substrate surface during subsequent etching to form sidewall spacers 16, typically formed of silicon nitride. Reference character 14 illustrates a moderate or heavy doped source/drain region typically implanted subsequent to forming sidewall spacers 16.

Difficulties are encountered in implementing conventional semiconductor fabrication techniques, such as those used to form the structure illustrated in FIG. 1. For example, during high temperature processing, as during deposition of the silicon oxide liner 15 by low pressure chemical vapor deposition, typically at a temperature of about 700° C. or higher, dopant impurities implanted into the source/drain extensions 13, such as P-type impurities, particularly boron (B) impurities, diffuse and segregate in the oxide liner 15. Such diffusion loss from the source/drain extensions are manifestly disadvantageous, as by increasing the resistance of the source/drain extensions. A prior attempt to resolve this problem comprises ion implanting the dopant impurity, e.g., B or $BF_2$, at an increased implantation dosage in order to compensate for the diffusion loss. However, this approach disadvantageously results in a deeper junction depth ($X_j$) which is inconsistent with the continuous drive toward miniaturization.

Another disadvantage attendant upon conventional practices is that the use of oxide liner 15 to prevent substrate surface damage requires the use of a material for the sidewall spacer which can be selectively etched with respect to oxide liner 15, such as a silicon nitride or a silicon oxynitride which have a high dielectric constant (k), e.g., in excess of about 7.

There exists a continuing need for semiconductor devices having transistors with improved performance, shallow junction depths ($X_j$) and enhanced operating speed, and for enabling methodology. There exists a particular need for high density semiconductor devices having a design rule of about 0.12 micron and under with highly reliable transistors and high operating speed.

DISCLOSURE OF THE INVENTION

An advantage of the present invention is a high density semiconductor device having transistors with improved performance.

Another advantage of the present invention is a method of fabricating a high density semiconductor device having transistors with improved performance.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect the present invention, the foregoing and other advantages are achieved in part by a semiconductor device comprising: a gate electrode, having side surfaces, over an upper surface of a substrate with a gate dielectric layer therebetween; an oxide liner on the side surfaces of the gate electrode and the upper surface of the substrate; a nitride liner on the oxide liner; and a sidewall spacer on the nitride liner.

Another aspect of the present invention is a method of manufacturing a semiconductor device, the method comprising: forming a gate electrode, having side surfaces, over an upper surface of a substrate with a gate dielectric layer therebetween; forming a composite liner comprising: an oxide liner on the side surfaces of the gate electrode and the upper surface of the substrate; and a nitride liner on the oxide liner; and forming a sidewall spacer on the composite liner.

Embodiments of the present invention include depositing an initial silicon oxide liner directly on the side surfaces of the gate electrode and the upper surface of the substrate by decoupled plasma deposition, depositing a silicon nitride liner directly on the silicon oxide liner by decoupled plasma deposition, and then forming a layer of spacer material on the silicon nitride liner. Decoupled plasma deposition of the silicon oxide liner layer and silicon nitride liner layer is implemented at a temperature not greater than about 400° C., thereby minimizing exposure of the substrate to an elevated temperature in order to reduce diffusion o f impurities out o f the shallow source/drain extensions. Anisotropic etching is then conducted to form the sidewall spacers. Etching is then implemented to selectively remove the portions of the silicon nitride layer and silicon oxide layer from the upper surface of the gate electrode. Embodiments of the present invention further include forming the sidewall spacer from silicon dioxide, thereby enabling a reduction in the capacitance of the resulting structure vis-à-vis a structure comprising silicon nitride or silicon oxynitride sidewall spacers, thereby enhancing operating speed.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF THE DRAWINGS

In FIGS. 2 through 4, similar features or elements are denoted by similar reference characters.

DESCRIPTION OF THE INVENTION

Figure 1:
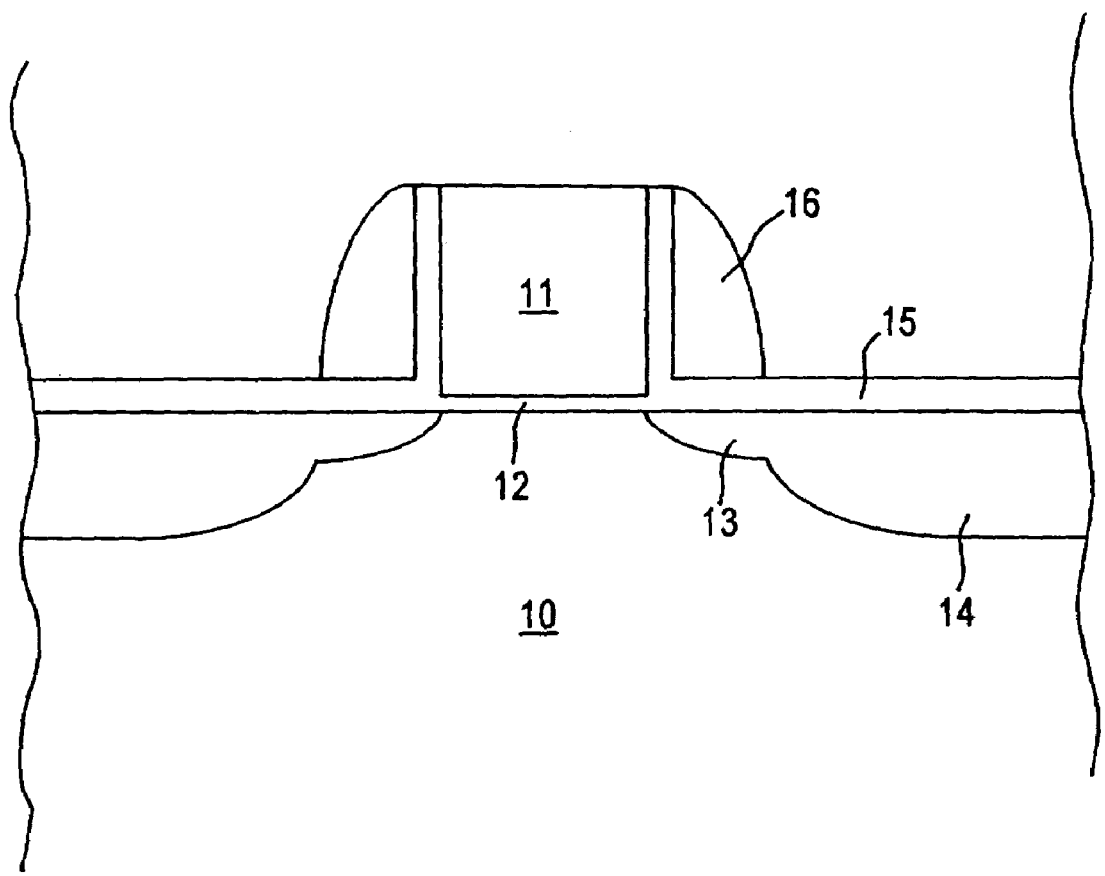
FIG. 1 schematically illustrates a conventional transistor structure.

The present invention addresses the continuing demand for miniaturization and highly reliable semiconductor devices. The present invention provides semiconductor devices with enhanced transistor performance, and enabling methodology, by strategically forming composite oxide/nitride liners on the side surfaces of the gate electrode and upper surface of the substrate vis-à-vis a conventional oxide liner, thereby enabling the use of oxide sidewall spacers having a lower dielectric constant (k) than conventional silicon nitride or silicon oxynitride sidewall spacers, with an attendant improvement in operating speed. Embodiments of the present invention further include depositing the oxide and nitride liner layers by decoupled plasma deposition techniques employing a relatively low temperature, such as about 400° C. or less, thereby significantly reducing diffusion of impurities, such as P-type impurities, e.g., B and $BF_2$, while maintaining a relatively small junction depth ($X_j$) of about 200 Å to about 300 Å. In addition, the oxide liner can be made arbitrarily thin to minimize impurity loss from segregation, while the decoupled plasma nitride layer can be made thick enough to act as a sufficient etch stop for the spacer etch.

Decoupled plasma deposition basically comprises techniques wherein a plasma is generated in a region or chamber remote from the region or chamber wherein actual deposition occurs, as in a separate chamber. The plasma generated vapors are then transported to the deposition region or chamber. Hence, deposition may be implemented at a lower temperature than the temperature at which the plasma is generated. The use of such lower temperatures prevents diffusion of impurities out of the shallow source/drain extensions, thereby enabling a small junction depth to be maintained. Moreover, by conducting decoupled plasma deposition, the substrate is not exposed to plasma conditions, thereby minimizing substrate damage with an attendant improvement in transistor performance/reliability. Thus, by depositing the oxide and nitride liners by decoupled plasma deposition, the substrate is not exposed to the elevated temperature and plasma conditions as when depositing the liners in the same chamber in which the plasma is generated, as when the substrate is positioned under the generated plasma. And the oxide liner portion can be made very thin to minimize dopant segregation into the oxide liner.

Embodiments of the present invention comprise depositing an initial silicon oxide liner on the upper surface and side surfaces of a gate electrode and the upper surface of the substrate surface, subsequent to ion implantation to form shallow source/drain extensions, by decoupled plasma depostion at a temperature less than about 400° C., at a minimal thickness, such as about 10 Å to about 50 Å. A silicon nitride liner is then deposited on the silicon oxide liner by decoupled plasma deposition at a temperature less than about 400° C., at an appropriate thickness, such as about 50 Å to about 200 Å. The silicon oxide liner and silicon nitride liner are substantially conformal. A substantially conformal spacer layer is then deposited, such as silicon dioxide. Advantageously, the silicon nitride portion of the composite liner functions as an etch stop layer during anisotropic etching to form the sidewall spacers. Subsequent processing may be implemented in a conventional manner by forming moderately or heavily doped source/drain implants followed by activation annealing. Selective etching is then conducted to remove the silicon nitride liner and silicon oxide liner portions from the upper surface of the gate electrode and silicon substrate prior to conventional silicide formation.

It should be recognized that the initial silicon oxide liner and silicon nitride liner formed thereon can be deposited by any conventional deposition techniques with an attendant advantage in flexibility in selecting the sidewall spacer material, e.g., a lower dielectric constant (k) material, such as silicon dioxide. However, by implementing decoupled plasma deposition of the silicon oxide and silicon nitride liners of the composite liner, the substrate is not exposed to plasma conditions with an attendant improvement in the transistor performance. Moreover, the use of a low temperature during decoupled plasma deposition (and thin oxide liner portion) avoids unnecessary diffusion and segregation of dopant impurities, such as B, from shallow source/drain extensions.

Figure 2:
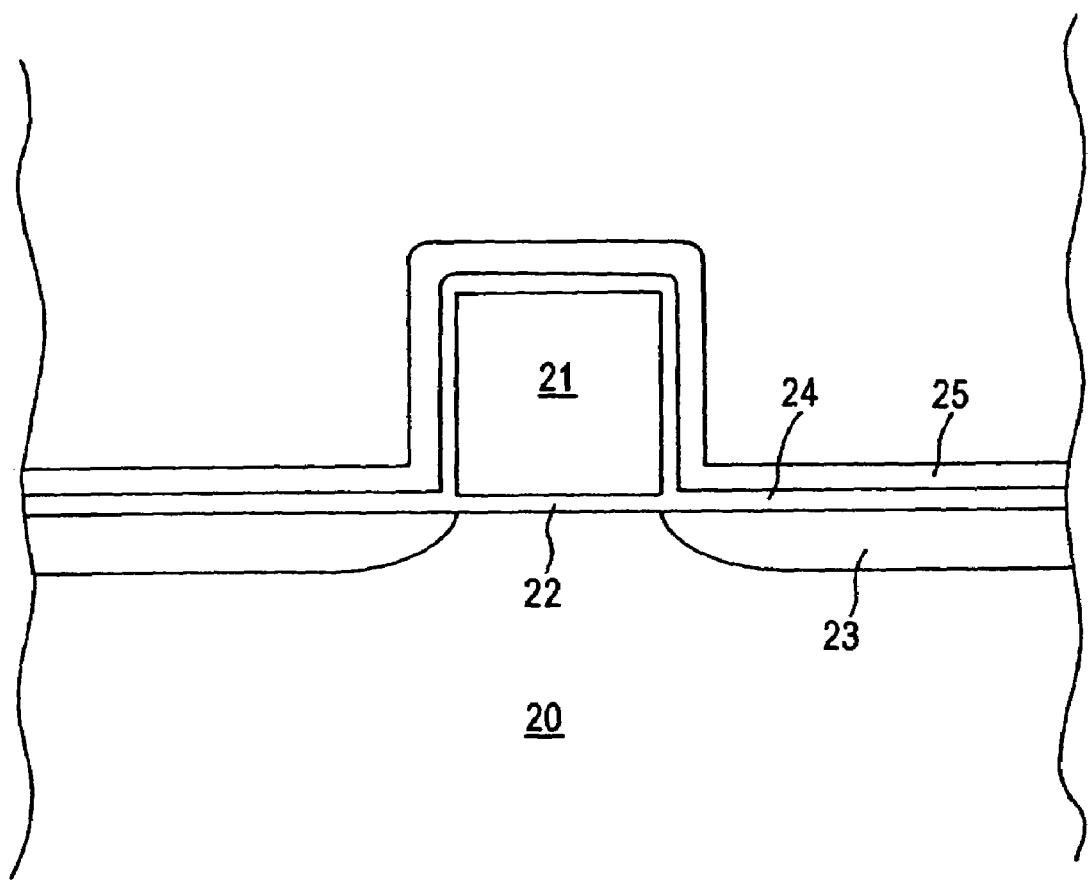
FIGS. 2 though 4 schematically illustrate sequential steps of a method in accordance with an embodiment of the present invention.
Figure 3:
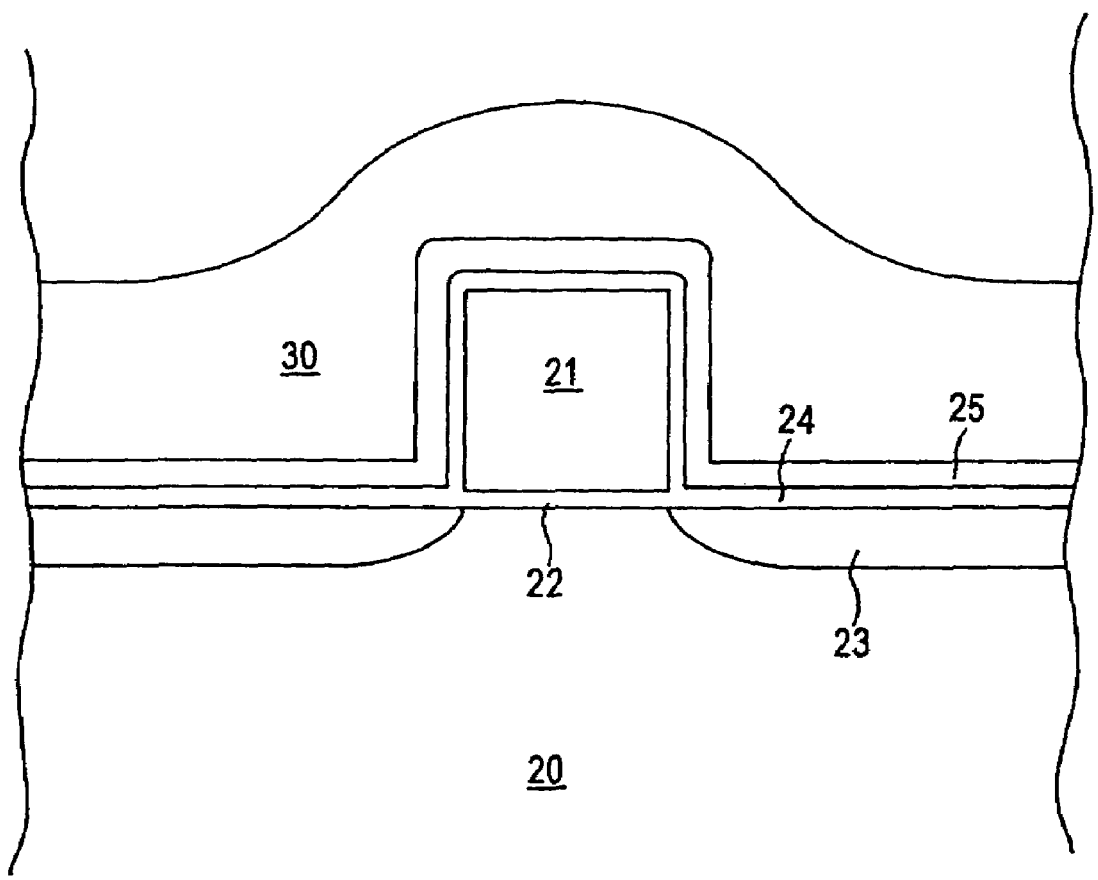
Figure 4:
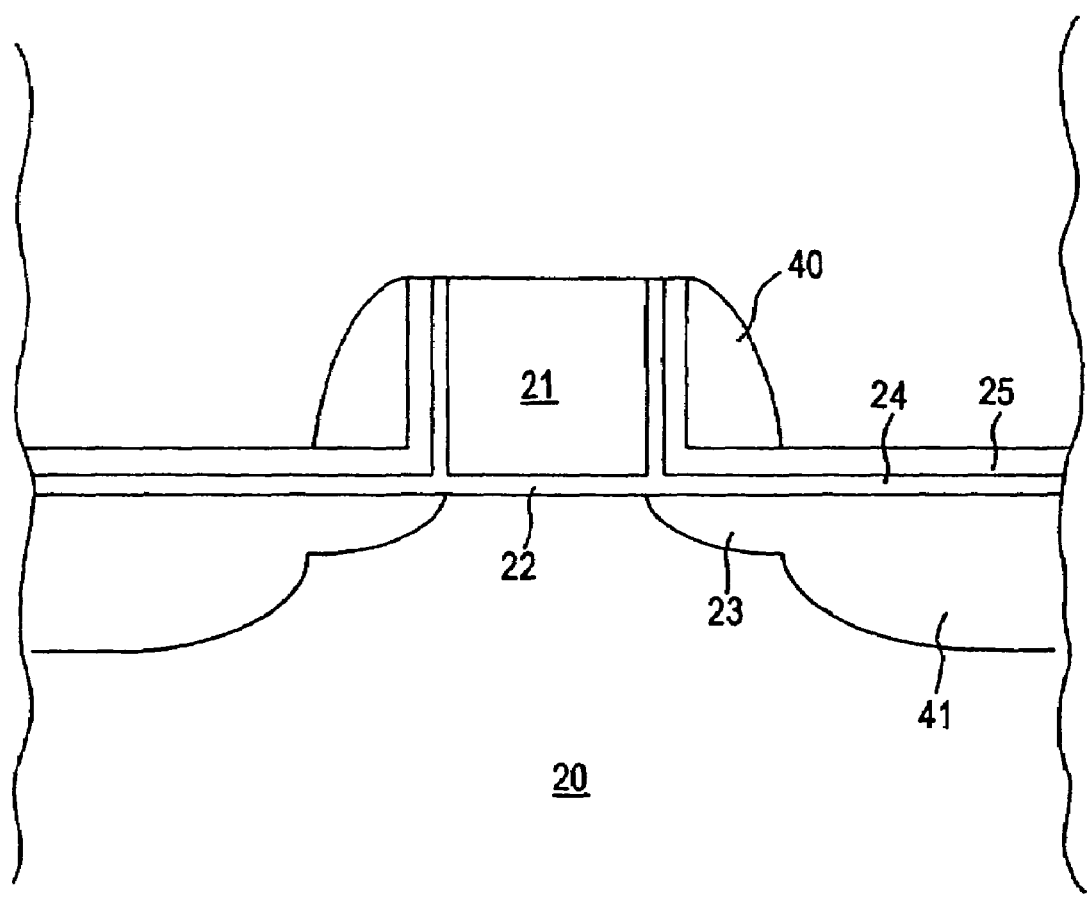

An embodiment of the present invention is schematically illustrated in FIGS. 2 through 4, adverting to FIG. 2, a gate electrode 21 typically doped polycrystalline, is formed over substrate 20, typically doped monocrystalline silicon, an epitaxial layer formed on the semiconductor substrate or a well region. Using the gate electrode 21, as a mask, impurities are ion implanted into substrate 20, such as B, for forming shallow source/drain extensions 23. Subsequently, an initial silicon oxide layer 24 is deposited by decoupled plasma deposition at a temperature less than about 400° C. at a thickness of about 10 Å to about 50 Å. A silicon nitride layer 25 is then deposited by decoupled plasma deposition at a temperature less than about 400° C. on silicon nitride layer 24, as at a thickness of about 50 Å to 200 Å. Advantageously, during such low temperature decoupled plasma deposition techniques, substrate 20 is not exposed to plasma conditions with an attendant improvement in transistor performance. Moreover, the use of a low temperature during decoupled plasma deposition and thin oxide liner avoids diffusion of B from shallow source/drain extensions 23 into the composite liner 24, 25, enabling the formation and maintenance of a shallow junction depth ($X_j$) of about 200 Å to about 300 Å.

Subsequently, as schematically illustrated FIG. 3, a layer of spacer material 30 is deposited, such as silicon dioxide. Adverting to FIG. 4, anisotropic etching is then conducted to form sidewall spacers 40, typically at a thickness at the substrate surface of about 600 Å to about 1,200 Å. Advantageously, silicon nitride layer 25 serves as an etch stop layer during etching to form sidewall spacers 40, thereby avoiding damage to substrate 20. Subsequent processing includes selective removal of portions of the silicon nitride layer 25, as by etching with HF or a buffered oxide etch, and then removal of silicon oxide layer 24, as with hot phosphoric acid, from the upper surface of gate electrode 21 and substrate 20. Ion implantation is conducted to form moderately or heavily doped source/drain regions 41 resulting in the structure illustrated in FIG. 4, prior or subsequent to removing the portions of silicon nitride layer 25 and silicon oxide layer 40 from the upper surface of gate electrode 21.

Figure 5:
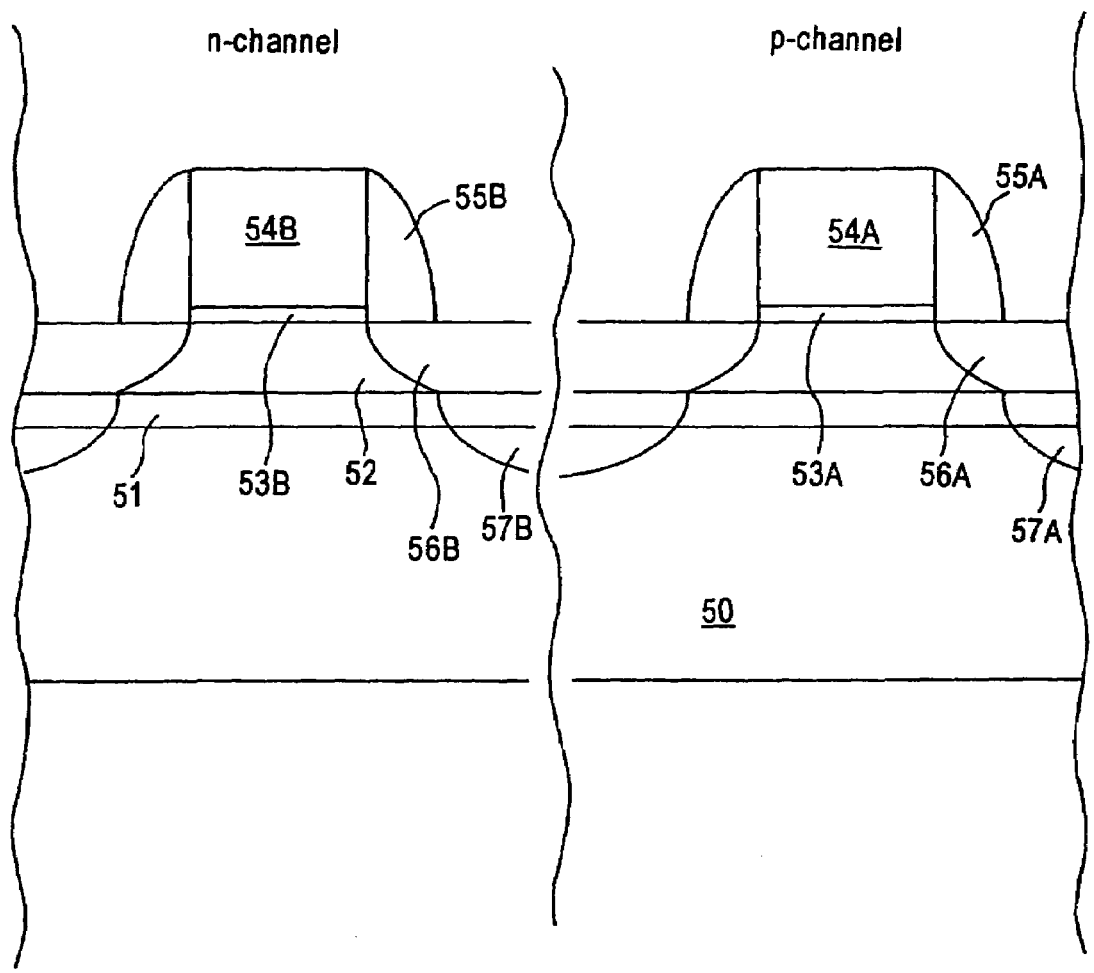
FIG. 5 schematically illustrates another inventive aspect.

Another inventive aspect comprises the formation of CMOS devices with an N/P drive current ratio in an acceptable range, e.g., about 1.8 to about 2.5. This objective is achieved by embodiments wherein the amount of Si, Ge and C in the layer between a strained Si cap layer and substrate is adjusted to balance the electron and hole mobilities. The amount of strain can be engineered by specific concentration adjustments to keep the transistors matched. For example, adverting to FIG. 5, a CMOS structure is schematically illustrated comprising a p-channel transistor and an n-channel transistor formed on substrate 50, typically Si. A layer 51 of Si—Ge—C is formed on Si substrate 50 and a strained Si layer 52 is formed on layer 51. Layer 51 may be formed at an appropriate thickness, such as about 100 Å to about 200 Å, while layer 52 may be formed at an appropriate thickness, such as about 100 Å to about 300 Å. The p-channel transistor comprises a gate electrode 54A formed on gate dielectric layer 53A with shallow source/drain extensions 56A and moderate or heavy source/drain regions 57A, typically after forming sidewall spacers 55A. The n-channel transistor comprises gate electrode 54B formed on gate dielectric layer 53B, shallow source/drain extensions 56B and moderate or heavy source/drain regions 57B, typically formed after forming sidewall spacers 55B. Alternatively, ion implantation may be implemented prior to etching to form the sidewall spacers. Layer 51 comprises Si at a concentration of about 60 to about 90 atomic percent, Ge at a concentration of about 10 to about 40 atomic percent and C at a concentration of about 1 to about 10 atomic percent. By adjusting the amounts of Si, Ge and C within these compositional ranges, the strain in the Si layer 52 can be adjusted to balance electron and hole mobility, thereby maintaining the N/P drive current ratios within an acceptable range of about 1.8 or, e.g., about 1.8 to about 2.5.

The present invention enables the fabrication of semiconductor devices exhibiting improved transistor performance and shallow junction depths ($X_j$), e.g., of about 200 Å to about 300 Å, with reduced capacitance and, hence, increased operating speed, by employing silicon oxide sidewall spacers. Embodiments of the present invention avoid exposing the substrate to elevated temperatures and plasma conditions during liner depositions, with an attendant improvement in transistor performance consistent with the continuous drive for miniaturization.

The present invention enjoys industrial utility in fabricating any various types of semiconductor devices. The present invention enjoys particular industrial utilizing fabricating high density semiconductor devices with a design rule of about 0.12 micron and under having increased operating speed.

In the previous description, numerous specific details are set forth, such as specific materials, structures, reactants, processes, etc., in order to provide a better understanding of the present invention, however, the present invention can be practiced without resorting to the details specifically set forth. In other instances, well-known processing materials and techniques have not been described in order not to unnecessarily obscure the present invention.

Only the preferred embodiment of the invention and but a few examples of its versatility are shown and described in the present disclosure. It is to be understood that the present invention is capable of use in various other combinations and environments, and is capable of changes or modifications within the scope of the inventive concept as expressed herein.

What is claimed is:

1. A method of manufacturing a semiconductor device, the method comprising:
    forming a gate electrode, having side surfaces, over an upper surface of a substrate with a gate dielectric layer therebetween;
    depositing an oxide liner, by decoupled plasma deposition at a temperature no greater than about 400° C., on the side surface of the gate electrode and the upper surface of the substrate;
    depositing a nitride liner, at a thickness of about 50 Å to about 200 Å, on the oxide liner by decoupled plasma deposition at a temperature no greater than about 400° C.; and
    forming a sidewall spacer on the nitride liner.

2. The method according to claim 1, wherein:
    the oxide liner comprises a silicon oxide;
    the nitride liner comprises a silicon nitride; and
    the sidewall spacer comprises a silicon oxide, silicon nitride or silicon oxynitride.

3. The method according to claim 2, comprising forming the sidewall spacer of a silicon oxide having a dielectric constant (k) no greater than about 3.9.

4. The method according to claim 2, further comprising ion implanting to form shallow source/drain extensions in the upper surface of the substrate, using the gate electrode as a mask, before depositing the oxide liner.

5. The method according to claim 4, comprising ion implanting a P-type impurity to form the source/drain extension.

6. The method according to claim 5, wherein the P-type impurity comprises boron.

7. The method according to claim 6, comprising forming the source/drain extensions at a junction depth ($X_j$) of about 200 Å to about 300 Å.

8. The method according to claim 2, comprising:
    depositing the silicon oxide liner at a thickness of about 10 Å to about 50 Å.

* * * * *